(12) United States Patent
Shahaf et al.

(10) Patent No.: US 6,420,986 B1
(45) Date of Patent: Jul. 16, 2002

(54) DIGITAL SPEECH PROCESSING SYSTEM

(75) Inventors: Mark Shahaf, Ashdod; Izak Avayu, Mevaseret Zion; Aviad Cohen, Petah-Tikva, all of (IL)

(73) Assignee: Motorola, Inc., Shaumburg, IL (US)

( * ) Notice: Subject to any disclaimer, the term of this patent is extended or adjusted under 35 U.S.C. 154(b) by 188 days.

(21) Appl. No.: 09/630,755

(22) Filed: Aug. 2, 2000

(30) Foreign Application Priority Data

Oct. 20, 1999 (GB) .............................................. 9924888

(51) Int. Cl.⁷ ................................................ H03M 1/62
(52) U.S. Cl. ........................ 341/139; 381/41; 704/225
(58) Field of Search .......................... 341/139; 704/225, 704/233, 221, 205, 230, 226, 231; 381/46, 50, 42, 41

(56) References Cited

U.S. PATENT DOCUMENTS

| | | | |
|---|---|---|---|
| 3,974,336 A | * | 8/1976 | O'Brien ..................... 179/1 SA |
| 4,441,202 A | * | 4/1984 | Tong et al. .................... 381/68 |
| 4,515,158 A | * | 5/1985 | Patrick et al. .......... 128/419 R |
| 4,777,649 A | * | 10/1988 | Carlson et al. ............... 381/46 |
| 4,959,865 A | * | 9/1990 | Stettiner et al. .............. 381/46 |
| 5,029,162 A | | 7/1991 | Epps |
| 5,146,504 A | | 9/1992 | Pinckley |
| 5,267,322 A | | 11/1993 | Smith et al. |
| 5,841,385 A | | 11/1998 | Xie |
| 6,260,017 B1 | * | 7/2001 | Das et al. .................... 704/265 |

FOREIGN PATENT DOCUMENTS

EP             0 218 870 A2    4/1987

* cited by examiner

Primary Examiner—Brian Young
Assistant Examiner—John Nguyen
(74) Attorney, Agent, or Firm—Steven R. Santema

(57) ABSTRACT

In a speech processing system (10) characterized by a finite range of audio levels, the speech processing system (10) receiving an incoming audio signal, the speech processing system amplifying (12) the incoming audio signal by an audio gain factor, the speech processing system (10) representing the amplified audio signal by the finite range of audio levels, a method for adjusting the audio gain factor, including the steps of: decreasing the audio gain factor when detecting clipping of the amplified audio signal, maintaining the audio gain factor for a hold time period, and increasing the gain factor when detecting that the result of amplification of the incoming sound levels by the audio gain factor, is lower than the highest level of the finite range of audio levels.

15 Claims, 3 Drawing Sheets

DIGITAL SPEECH PROCESSING SYSTEM

FIELD OF THE INVENTION

The present invention relates to sound processing in general, and to methods and systems for dynamically adjusting the gain of sound detection system, in particular.

BACKGROUND OF THE INVENTION

U.S. Pat. No. 5,841,385 to Xie, entitled "System and method for performing combined digital/analog automatic gain control for improved clipping suppression" describes a system and method for automatic gain control on received audio data. The system comprises an analog adjustable gain amplifier coupled to a digital gain control unit. The gain control unit comprises a long-term energy averager and gain calculator as well as a short-term energy averager and gain calculator, which receive the digital audio output signal. The gain calculators periodically generate gain adjustment outputs based on the average energy of the signal so as to attenuate or amplify the analog audio signal. The gain control unit further comprises a voice activity detector, which detects a presence of silence versus voice activity based on ratios of the long-term and short-term energy averages. The long-term averager pauses operation during silence. The gain control system amplifies the audio input signal only during the voice activity, thus suppressing noise amplification during periods of silence.

SUMMARY OF THE PRESENT INVENTION

It is an object of the present invention to provide a novel method and system for controlling the audio gain factor of a speech processing system.

I accordance with the present invention, there is thus provided a method for operating a speech processing system, characterized by a finite range of audio levels. The speech processing system receives an incoming audio signal and amplifies it by an audio gain factor. The speech processing system represents the amplified audio signal by the finite range of audio levels. The method includes the steps of: decreasing the audio gain factor when detecting clipping of the amplified audio signal, maintaining the audio gain factor for a hold time period, and increasing the gain factor when detecting that the result of amplification of the incoming sound levels by the audio gain factor, is lower than the highest level of the finite range of audio levels.

According to one aspect of the invention, the clipping can be determined where the result of amplification of the incoming sound levels by the audio gain factor, exceeds the highest level of the finite range of audio levels. Alternatively, clipping can be determined where the result of amplification of the average of the incoming sound levels by the audio gain factor, exceeds the highest level of the finite range of audio levels. According to another aspect of the invention, the clipping is determined where the result of amplification of RMS value of the incoming sound levels by the audio gain factor, exceeds the highest level of the finite range of audio levels. According to a further aspect of the invention, the clipping is determined where a mapped value of the result of amplification of RMS value of the incoming sound levels by the audio gain factor, exceeds the highest level of the finite range of audio levels.

The step of decreasing can be performed in the presence of speech. Accordingly, the method can further include a step of detecting speech in the incoming audio signal.

According to one aspect of the invention, the hold time period can be predetermined. The method can further include the step of determining the hold time period. According to another aspect of the invention, the hold time period can be variable. The method can further include a step of receiving the incoming audio signal.

The method of the present invention is applicable for both analog and digital incoming audio signals.

The step of increasing the gain factor can be preformed at a predetermined increase rate. Alternatively, the step of increasing the gain factor can be preformed at a variable increase rate. Hence, the method of the present invention can further include a step of determining a rate for increasing the gain factor. It is noted that this rate can be determined according to the above result.

According to a further aspect of the invention, the step of decreasing can be performed in the presence of speech. It can also be performed in performed continuously or discretely.

In accordance with a further aspect of the invention, there is thus provided a gain control system including a signal clipping detector, a hold mode unit, a release mode unit and a controller, connected to the signal clipping detector, the hold mode unit and the release mode unit. The clipping detector detects clipping of incoming audio signal, with respect to the current gain factor and a predetermined sampling range. The controller decreases the gain factor according to the detected clipping. The controller initiates the hold mode unit to maintain the decreased gain factor for a hold time period. The controller further initiates the release mode unit when the hold time period expires. The release mode unit determines an increase rate for increasing the gain factor.

The gain control system of the invention can further include a voice activity detector, connected to the controller, for initiating the signal-clipping detector in the presence of voice activity. In addition, the gain control system can further include an input interface connected to the controller, for receiving the incoming audio signal. The gain control system of the invention, can further include an RMS energy calculator for, connected to the controller, a look-up table, connected to the RMS energy calculator and a maximum detection unit, connected between the look-up table and the controller.

The RMS energy calculator continuously produces RMS values of portions of the incoming audio signal. The look-up table assigns a peek value for each the RMS values. The maximum detection unit determines a maximum peek value of successive ones of the peek values and provides the maximum peek value to the controller for further detection of clipping.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

The present invention overcomes the disadvantages of the prior art by providing a novel method and system, which dynamically controls and adjusts the gain level of incoming sound signals.

Figure 1:
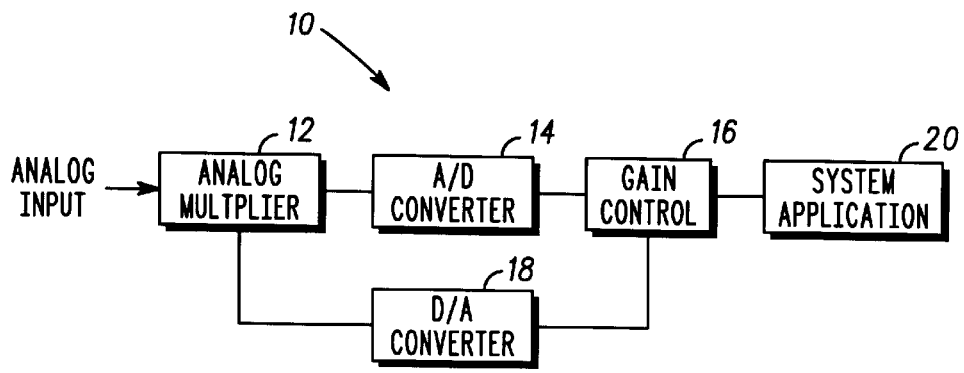
FIG. 1 is a schematic illustration of a digital speech communication system, constructed and operative in accordance with a preferred embodiment of the present invention.

Reference is now made to FIG. 1, which is a schematic illustration of a digital speech communication system, generally referenced 10, constructed and operative in accordance with a preferred embodiment of the present invention. Digital speech communication system 10 includes an analog multiplier 12, an analog-to-digital converter 14, a gain control unit 16, a digital-to-analog converter 18 and a system application 20.

Analog multiplier 12 is connected to analog-to-digital converter 14 and digital-to-analog converter 18. Gain control unit 16 is connected to analog-to-digital converter 14, digital-to-analog converter 18 and to system application 20.

Analog multiplier 12 scales an input analog signal block by a gain factor, determined by gain control system 16. The value of the gain factor is a result of the processing of the previous speech block. Analog multiplier 12 provides the scaled signal block to analog-to-digital converter 14, which converts it to a digital format thereof. The implementation of the analog-to-digital conversion depends on a specific type of hardware, used in application, as well as on a digital signal coding scheme. The digitized signal can be in 8-bit, 12-bit, 16-bit format or the like. Analog-to-digital converter 14 provides the digital signal block to gain control unit 16, which processes it and determines an updated gain factor. Gain control unit 16 provides the signal block further to system application 20, and the updated gain factor to digital-to-analog converter 18. Digital-to-analog converter 18 converts the gain factor from a digital to an analog form and provides it to analog multiplier 12. Analog multiplier 12 scales the next analog signal block, using the updated value of the gain factor.

Figure 2:
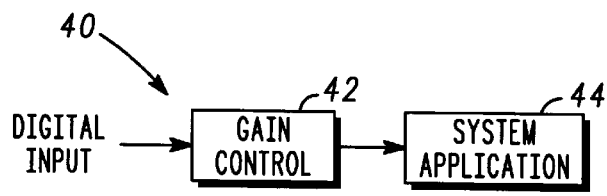
FIG. 2 is a schematic illustration of a digital speech communication system, constructed and operative in accordance with a further preferred embodiment of the present invention.

Reference is now made to FIG. 2, which is a schematic illustration of a digital speech communication system, generally referenced 40, constructed and operative in accordance with a further preferred embodiment of the present invention. System 40 includes a gain control unit 42 and a system application 44, which are connected to each other.

Gain control unit 42 processes an input digital signal block and scales it by a gain factor. The gain factor value is a result of the processing of the signal block. The scaling can be applied to the current signal block, as well as to the next one. Gain control unit 42 provides the scaled digital signal block to system application 20.

Figure 3:
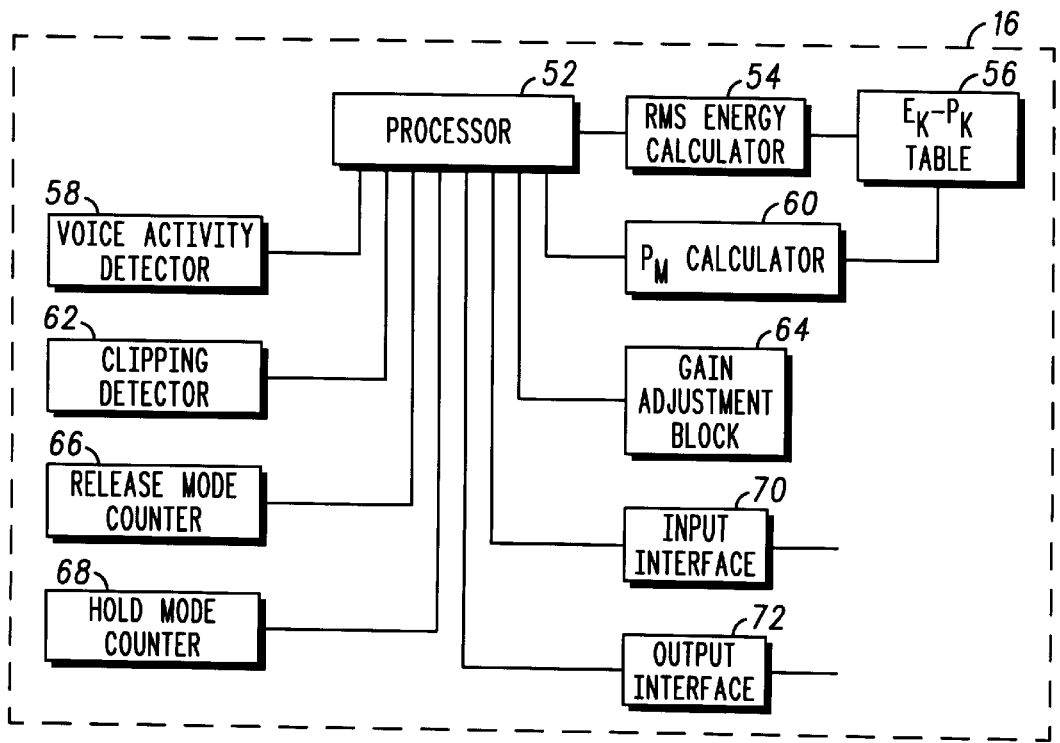
FIG. 3 is a schematic illustration of the gain control unit of the system of FIG. 1, constructed and operative in accordance with a further preferred embodiment of the present invention.

Reference is now made to FIG. 3, which is a schematic illustration of gain control unit 16 (FIG. 1), constructed and operative in accordance with a further preferred embodiment of the present invention.

Gain control unit 16 includes a processor 52, an RMS energy calculator 54, a look-up table 56, a voice activity detector 58, a maximum peak calculator 60, a clipping detector 62, a gain adjustment unit 64, a release mode counter 66, a hold mode counter 68, an input interface 70 and an output interface 72.

Processor 52 is connected to voice activity detector 58, clipping detector 62, release mode counter 66, hold mode counter 68, RMS energy calculator 54, maximum peak calculator 60, gain adjustment unit 64, input interface 70 and to output interface 72. Look-up table 56 is connected to RMS energy calculator 54 and to maximum peak calculator 60.

Processor 52 receives a digital signal block via input interface 70. Voice activity detector 58 determines the presence/absence of a speech signal and generates a respective control signal thereof. If the speech signal is present, then the system enters the ATACK MODE. RMS energy calculator 54 determines speech block energy and maps its value to a respective amplitude peak value, using look-up table 56. Clipping detector 62 detects the presence/absence of a clipped speech signal, using determined amplitude peak value, and generates respective control signals thereof. If the speech signal is clipped, then gain adjustment unit 64 updates the value of the gain factor and provides it to analog multiplier 12 (FIG. 1) via output interface 72. Processor 52 resets release mode counter 66 and hold mode counter 68 and provides the current speech block to system application 20 (FIG. 1) via output interface 72.

If the speech signal is not clipped, then the system is in a HOLD MODE. The duration of the HOLD MODE is predetermined by the settings of hold mode counter 68. The HOLD MODE time will expire only, if during a predetermined time $T_h$ no signal clipping will be detected. During the HOLD MODE, there is no gain adjustment. Instead, $P_M$ calculator 60 determines a maximum amplitude peak value $P_M$ for a predetermined number M of speech blocks. The M value is determined as an integer ratio of $T_h$ to a single speech block duration. After the HOLD MODE time is expired, the system switches to a RELEASE MODE. In this mode, gain adjustment unit 64 updates the gain factor and provides a new value to analog multiplier 12. The new gain factor value is applied gradually, since speech-coding schemes are sensitive to rapid gain variations. Equations, governing the gain factor variations, will be described in details hereinafter.

Figure 4:
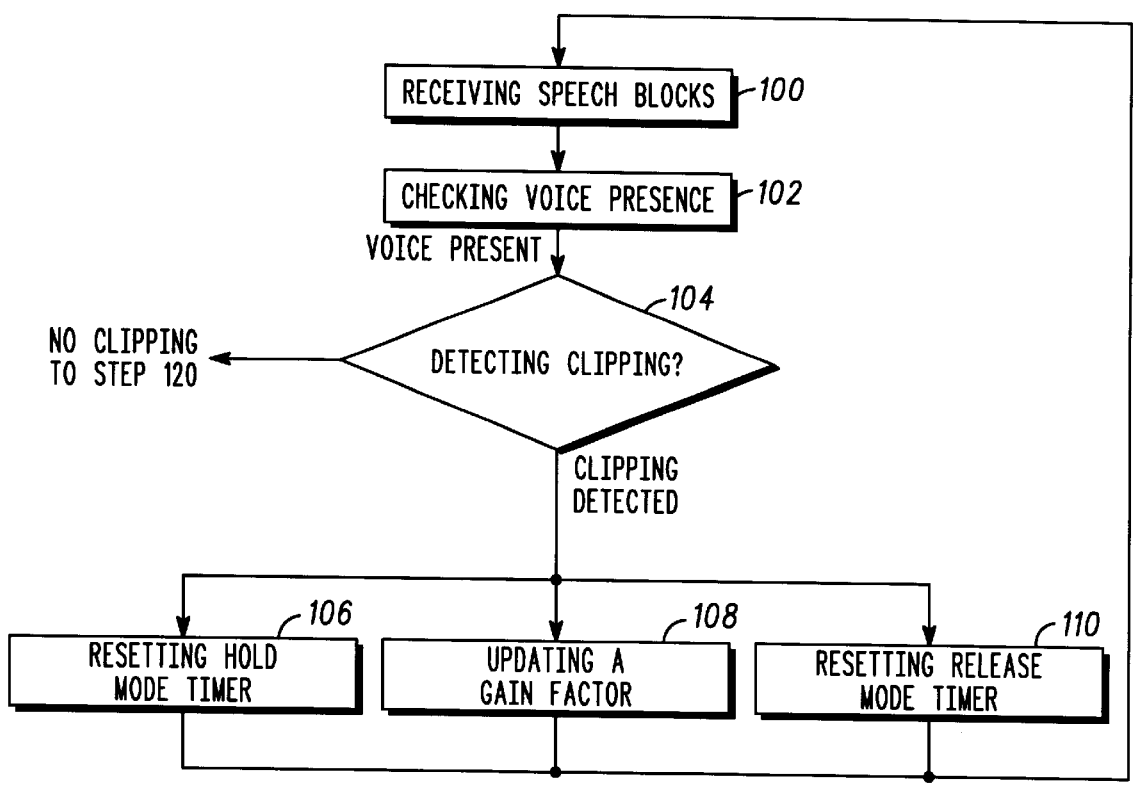
FIG. 4 is an illustration of a first stage (ATTACK MODE) of a method for operating the gain control unit of FIG. 3, operative in accordance with another preferred embodiment of the present invention.
Figure 5:
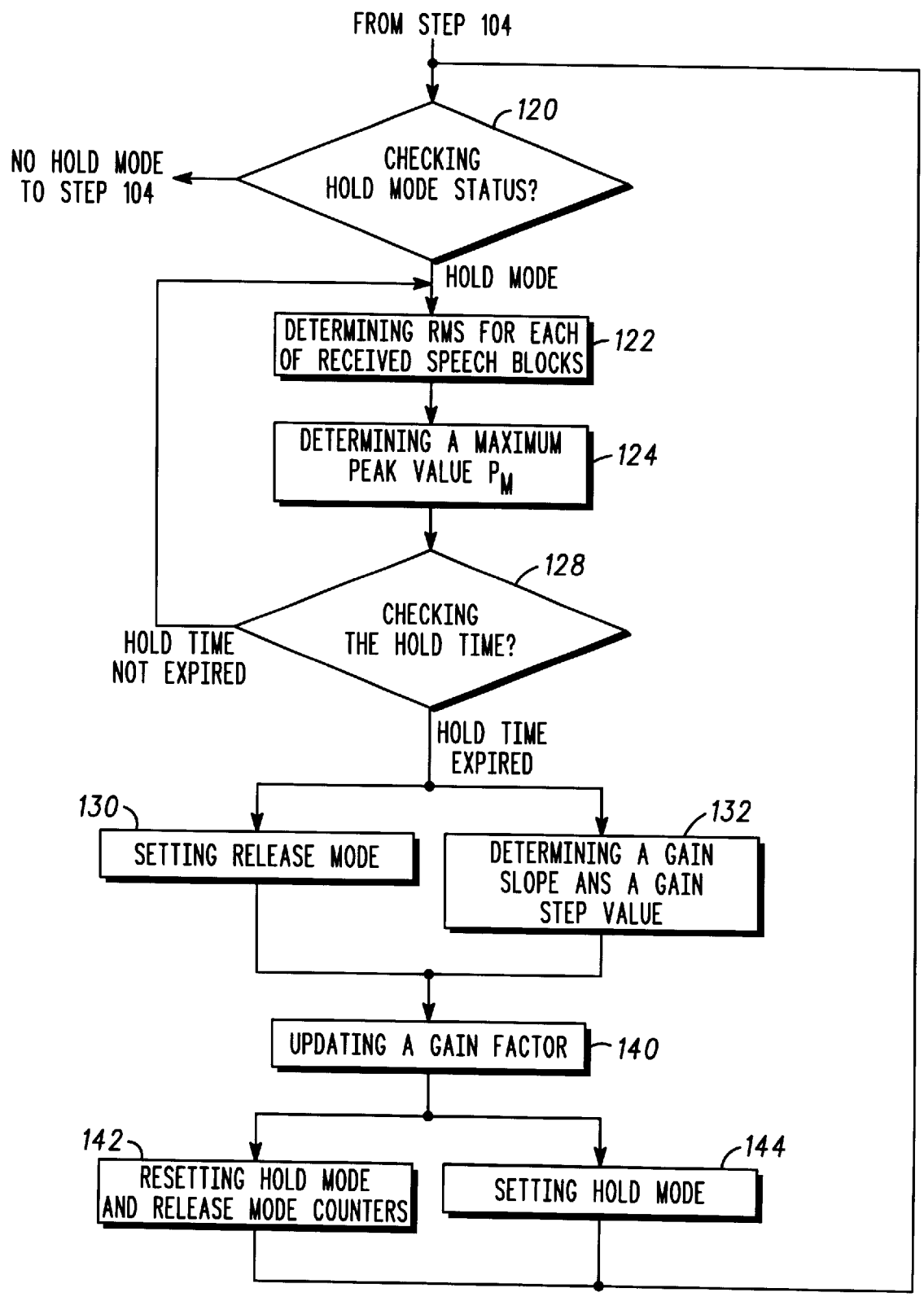
FIG. 5 is an illustration of a second stage (HOLD MODE) and of a third stage (RELEASE MODE) of a method for operating the gain control unit of FIG. 3, operative in accordance with embodiments of the invention.

Reference is further made to FIGS. 4 and 5, which are a schematic illustration of a method for operating gain control unit 16 (FIG. 3), operative in accordance with a further preferred embodiment of the present invention.

FIG. 4 is an illustration of a first stage (ATTACK MODE) of a method for operating the gain control unit of FIG. 3, operative in accordance with another preferred embodiment of the present invention.

FIG. 5 is an illustration of a second stage (HOLD MODE) of a method for operating gain control unit of FIG. 3, operative in accordance with another preferred embodiment of the present invention.

With reference to FIG. 4, in step 100 a digital speech signal block is received. With the reference to FIG. 3, processor 52 receives the speech signal block via input interface 70. At this stage, all system settings and parameters, such as gain factor, hold mode and release mode counters and the like, are set to values, which were determined during the processing of the previous signal block.

In step 102 a voice activity presence is detected. With the reference to FIG. 3, voice activity detector 58 determines the presence or absence of the voice activity. If the voice activity is detected, then the system proceeds to step 104. Otherwise, the method is repeated from step 100. Methods and systems for detecting voice activity are known in the art and are disclosed, for example, in U.S. Pat. No. 5,649,055 to Gupta et al., and in U.S. Pat. No. 5,749,067 to Barrett.

In step 104, the presence or absence of signal clipping is determined. With the reference to FIG. 3, RMS energy calculator 54 determines an RMS energy of the signal block according to the following expression:

$$E_k = \frac{1}{N}\sum_{i=1}^{N} s^2(i), \qquad (1)$$

where k is the index of the speech block, N is a number of speech samples per block and s(i) is the value of an i-th speech sample.

The value $E_k$ is further used for determining a respective signal block peak value $P_k$. This is achieved by mapping the value of $E_k$ to a respective peak value $P_k$, using $E_k \rightarrow P_k$ table 56, which sets one-to-one correspondence between the values of $E_k$ and $P_k$. Speech signals can introduce instantaneous peak values, which do not affect speech quality even if they are clipped. Thus, the use of the "averaged" peak values $P_k$ is more preferable than the use of the instantaneous ones. Inventors have found that the mapping of RMS energy to peak value increases the robustness of the gain control.

For the system of FIG. 2, the $P_k$ value is scaled in accordance with the expression:

$$\hat{P}_k = G \cdot P_k, \qquad (2)$$

where $\hat{P}_k$ is the scaled signal peak value and G is the current value of the gain factor. For the system of FIG. 1, the peak value $P_k$ is already scaled and hence, $\hat{P}_k = P_k$.

Processor 52 compares the value of $\hat{P}_k$ to a clipping threshold level $T_c$. If $\hat{P}_k > T_c$, which indicates a clipping status, the system enters the ATTACK MODE and proceeds to steps 106, 108 and 110. Otherwise, the system proceeds to step 120 (FIG. 5), described hereinafter.

In step 108 the gain factor value is updated. With the reference to FIG. 3, processor 52 derives a new gain factor value G', according to the expression:

$$G' = \frac{T_c}{\hat{P}_k}. \qquad (3)$$

In steps 106 and 110, the hold mode and release mode timers are reset respectively. With the reference to FIG. 3, processor 52 resets both hold mode counter 66 and release mode counter 68.

Upon completion of steps 106, 108 and 110, the system exits the ATTACK MODE and returns to step 100. With reference to FIG. 5, in step 120, the HOLD MODE status is checked. With the reference to FIG. 3, processor 52 detects the presence/absence of the HOLD MODE. If the system is in the HOLD MODE, it proceeds further, to step 122. At this stage, clipping (step 104) can end the hold mode status where the system will proceed from step 104.

In step 122, the RMS energy value for each of the received signal blocks is determined. With the reference to FIG. 3, RMS energy calculator 54 determines the RMS energy values for each of the M speech blocks, according to expression (1). The RMS energy values are then mapped to respective peak values $P_k$, using look-up $E_k \rightarrow P_k$ table 56.

In step 124, a maximum peak value $P_M$ is determined. With the reference to FIG. 3, $P_M$ calculator 60 determines the maximum peak value $P_M$ out of M peak values $P_k$. It is noted that there are several ways to determine $P_M$. For example, for each successive k-th speech block processed, the following recurrent expression can be used:

$$P_m = \max\{P_k, P_{k-1}\}, \qquad (4)$$

where $P_m$ is the maximum peak value of $P_k$, $P_{k-1}$.

Thus, applying expression (4) to all incoming speech blocks, the $P_M$ value will be determined at the end of the HOLD MODE time period.

In step 128, the hold time is checked. With the reference to FIG. 3, processor 52 compares the value th of hold mode counter 68 with a predetermined value $T_h$. If $t_h < T_h$, then the hold time is not expired yet and the system proceeds back to step 122. Otherwise, the system proceeds to steps 130 and 132.

In step 132, a gain slope value and a gain step value are determined. With the reference to FIG. 3, processor 52 determines the optimal gain factor $G_{opt}$, according to the expression:

$$G_{opt} = \frac{T_c}{P_M}. \qquad (5)$$

This gain factor value provides the maximum accuracy. This is achieved by allocating the values of the signal samples within the most significant bits rather than within the least significant ones.

As was already mentioned above, the optimal gain factor value is not altered instantaneously, but is modified as a step-wise linear function. The value of the gain factor varies from the current gain factor G to the new derived optimal gain factor $G_{opt}$. Processor 52 determines the slope of the function as a ratio of $G - G_{opt}$ to the pre-determined RELEASE MODE duration $T_r$. Processor 52 determines further the step size Δ according to the expression:

$$\Delta = \frac{G - G_{opt}}{\text{int}(T_r/T_s)}, \qquad (6)$$

where int( . . . ) denotes an integer operator and $T_s$ is a speech block duration.

In step 142, the hold mode and release mode counters are reset. With the reference to FIG. 3, processor 52 resets hold/release mode counters 66 and 68 respectively.

In step 144, the HOLD MODE is set. With the reference to FIG. 3, processor 53 sets the HOLD MODE, and the system goes back to step 120 (FIG. 5).

It is noted, that the RELEASE MODE can be terminated without reaching the final gain value $G_{opt}$, if the ATTACK MODE is re-initiated, thereby proceeding immediately to step 100.

It will be appreciated by persons skilled in the art that the present invention is not limited to what has been particularly shown and described hereinabove. Rather the scope of the present invention is defined only by the claims, which follow.

What is claimed is:

1. A method of operation in a speech processing system, including receiving an incoming audio frequency signal by the speech processing system, amplifying the incoming audio frequency signal by an audio gain factor, representing the amplified audio signal by a finite range of audio levels, and adjusting the audio gain factor by applying the following steps:

in an attack mode initiated when a speech signal is detected to be present, analyzing one or more speech blocks of the amplified audio frequency signal to determine whether clipping of the amplified audio frequency signal has taken place;

in a hold mode applied whilst no gain adjustment is being applied and when it is detected in the attack mode that clipping has taken place, analyzing the energy level of one or more blocks of the amplified audio frequency signal to determine what required adjustment should be applied to the audio gain factor; and in a release mode applied following the hold mode, adjusting the audio gain factor according to the required adjustment determined in the hold mode.

2. A method according to claim 1 wherein a rate for applying the gain adjustment in the release mode is calculated in the hold mode.

3. A method according to claim 1 wherein the gain adjustment in the release mode is applied in steps.

4. A method according to claim 3 wherein the size of the steps applied is calculated in the hold mode.

5. A method according to claim 1 wherein from an energy level measurement of one or more speech blocks a corresponding average block peak value is calculated by which determination of required gain adjustment is made.

6. A method according to claim 1 wherein clipping is determined to have taken place when the result of amplification of said incoming audio frequency signals by the audio gain factor exceeds the highest level of said finite range of amplified audio levels.

7. A method according to claim 1 wherein clipping is determined to have taken place when the result of amplification of the average of the incoming sound levels by the audio gain factor exceeds the highest level of the finite range of amplified audio levels.

8. A method according to claim 1 wherein clipping is determined to have taken place when the result of amplification of RMS energy value of said incoming sound levels by the audio gain factor exceeds the highest level of the finite range of amplified audio levels.

9. A method according to claim 1 wherein clipping is determined to have taken place when a mapped value of the result of amplification of an RMS value of the incoming sound levels by said audio gain factor exceeds the highest level of the finite range of amplified audio levels.

10. A method according to claim 1 wherein the step of adjusting the audio gain is performed in the presence of speech.

11. A method according to claim 1 which includes the step of detecting speech in said incoming audio frequency signal by a voice activity detector.

12. A method according to claim 1 wherein the hold mode is applied for a time period which is predetermined.

13. A method according to claim 1 wherein the hold mode is applied for a time period which is dynamically variable.

14. A method according to claim 1 wherein the amplified incoming audio frequency signal is further processed as an analogue signal.

15. A method according to claim 1 wherein the amplified incoming audio frequency signal is further processed as a digital signal.

* * * * *